United States Patent [19]

McClanahan et al.

[11] 4,046,666

[45] Sept. 6, 1977

[54] DEVICE FOR PROVIDING HIGH-INTENSITY ION OR ELECTRON BEAM

[75] Inventors: Edwin D. McClanahan; Ronald W. Moss, both of Richland, Wash.

[73] Assignee: The United States of America as represented by the United States Energy Research and Development Administration, Washington, D.C.

[21] Appl. No.: 684,418

[22] Filed: May 7, 1976

[51] Int. Cl.² .................... C23C 15/00; H01J 19/04
[52] U.S. Cl. .................... 204/298; 204/192 SP; 313/192; 313/306; 313/346 DC; 314/21
[58] Field of Search ............... 204/192, 298; 313/346 R, 346 DC, 306, 192; 314/21

[56] References Cited

U.S. PATENT DOCUMENTS

| | | | |
|---|---|---|---|
| 1,760,454 | 5/1930 | Ulrey | 204/192 |
| 1,821,238 | 9/1931 | Rentschler et al. | 313/176 |
| 1,894,946 | 1/1933 | Espe | 316/9 |
| 3,246,196 | 4/1966 | Ahmodt et al. | 313/310 |
| 3,348,092 | 10/1967 | Beggs | 313/346 |
| 3,467,878 | 9/1969 | Newberry | 313/346 |
| 3,474,281 | 10/1969 | Vitzthum | 313/337 |
| 3,507,774 | 4/1970 | Muly, Jr. | 204/298 |

*Primary Examiner*—John H. Mack
*Assistant Examiner*—Aaron Weisstuch
*Attorney, Agent, or Firm*—Dean E. Carlson; Frank H. Jackson; Hugh W. Glenn

[57] ABSTRACT

A thin film of a low-thermionic-work-function material is maintained on the cathode of a device for producing a high-current, low-pressure gas discharge by means of sputter deposition from an auxiliary electrode. The auxiliary electrode includes a surface with a low-work-function material, such as thorium, uranium, plutonium or one of the rare earth elements, facing the cathode but at a disposition and electrical potential so as to extract ions from the gas discharge and sputter the low-work-function material onto the cathode. By continuously replenishing the cathode film, high thermionic emissions and ion plasmas can be realized and maintained over extended operating periods.

10 Claims, 2 Drawing Figures

DEVICE FOR PROVIDING HIGH-INTENSITY ION OR ELECTRON BEAM

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

The present invention relates to low-pressure electronic devices for the production of high-intensity electron and ion beams. It has particular application to supported-gas-discharge sputtering devices, devices requiring high-intensity ion beams for simultaneous evaporation and sputter deposition, and high-intensity electron beams for melting, casting, evaporating or welding, as well as other applications requiring such high-intensity ion or electron beams. For purposes of this application the term "supported-gas-discharge sputtering device" is intended to include sputtering devices having a heated cathode capable of producing thermionic emissions.

Enhanced electron emissions have previously been obtained through use of thin films of easily polarized materials on cathode surfaces. Various films and dispensing mechanisms are described in Kohl, "Cathodes and Heaters," *Handbook of Materials and Techniques for Vacuum Devices* (Reinhold Publishing Corp., New York 1967, pages 484–503). The films are an admixture of the base material such as tungsten and an additive of an electropositive nature that is easily polarized. Additives of low-work-function materials such as cesium, cerium, barium, thorium, lanthanum, uranium, yttrium and zirconium are suggested for production of thin films that will exhibit thermionic work functions of lower magnitude than that of either the additive or the base metal. However, the use of such thin-film emitters has been limited due to additive loss from evaporation and sputtering during operation of the vacuum device. Various means of replenishing the additive at the cathode surface have been suggested, but none have proven completely satisfactory. For example, replenishment from the vapor phase is generally impractical in high-vacuum devices. In other systems, the additive is dispensed from the interior of the cathode, but its diffusion into the surface film may not be sufficient to offset loss.

SUMMARY OF THE INVENTION

It is an object of the present invention to provide a device for producing a high-current, low-pressure gas discharge with improved means for replenishing easily polarized atoms on the cathode surface.

It is a further object to provide an improved supported-gas-discharge sputtering device having extended filament life.

In accordance with the present invention, a device for producing an inert gas discharge is provided. The device includes a cathode and an anode within a gas-tight chamber provided with means for introducing an ionizable, inert gas at near vacuum pressures. Sufficient voltage is provided between the anode and cathode to produce a discharge or plasma. Within this device the improvement comprises an auxiliary electrode positioned near the cathode and connected to a source of negative electrical potential equal to or above that of the cathode. On at least one surface of the auxiliary electrode facing the cathode there is included a metal that can be mixed with the cathode material to provide a surface film with a reduced thermionic work function. During operation of the device, inert gas ions are extracted from the plasma to this auxiliary electrode surface, resulting in a sputtered deposition of that metal onto the cathode surface.

In a specific application of the present invention, the auxiliary electrode is incorporated into a supported-gas-discharge sputtering device including a target electrode and substrate. The auxiliary electrode is disposed nearer the cathode than the substrate, target electrode or anode and is positioned to minimize sputtering of the auxiliary electrode metal onto surfaces other than the cathode.

BRIEF DESCRIPTION OF THE DRAWINGS

The present invention is illustrated in the accompanying drawings wherein.

DETAILED DESCRIPTION OF THE PREFERRED EMBODIMENT

Figure 1:
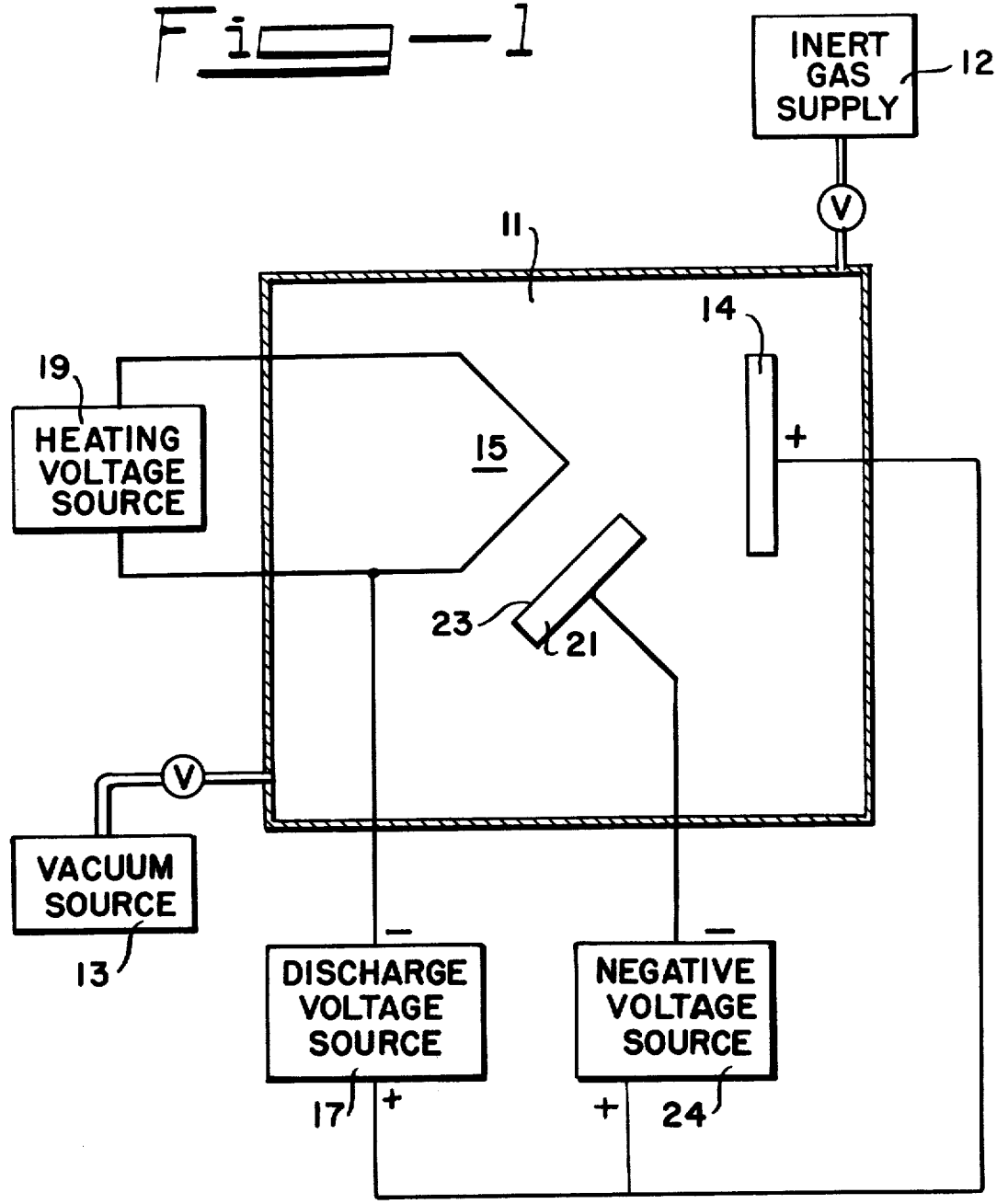
FIG. 1 is a schematic of a gas-discharge, low-pressure device.

In FIG. 1, a gas-tight vessel is illustrated at 11 equipped with suitable connections to an inert gas supply 12 and a vacuum source 13. Vacuums as low as 2 to 5 millitorr Ar, Kr or Xe are contemplated. Chamber 11 contains an anode 14 and cathode 15 connected to a suitable voltage source 17 to provide a gas plasma between the electrodes. A second voltage source 19 provides current for heating of the cathode filament.

The device as thus far described could be any device that produces an electrical discharge within a low-pressure inert gas. Such devices have been used to produce high-intensity ion beams for sputtering and for evaporation processes or for producing high-intensity electron beams for melting, casting, evaporating or welding, as well as other applications requiring high current flow. Gas discharge tubes are also contemplated in which low-pressure inert gas is sealed within a closed chamber or tube not having the inert gas or vacuum source connections shown. Such devices are well known.

The present invention introduces into gas discharge devices of these types an auxiliary electrode 21 that is disposed with a major surface 23 facing the cathode 15. The auxiliary electrode 21 is operated at a potential supplied by negative voltage source 24 sufficient to extract ions from the gas discharge plasma, resulting in the sputtering of atoms from surface 23 onto the surface of cathode 15. Ordinarily, auxiliary electrode 21 is disposed close to cathode 15 in comparison with other members within the device and is maintained at a voltage somewhat more negative than that of cathode 15. Typically, auxiliary electrode 21 is operated at about 2 to 5 times the cathode voltage.

Auxiliary electrode 21, or at least that portion at major surface 23, includes a relatively low-work-function metal that exhibits low vapor pressures at temperatures within the contemplated gas discharge devices. The metal is one that, when admixed with the material of the cathode 15, will provide a thermionic work function of the combination that is less than that of either of the constituents alone.

The cathode 15 will normally be of a heat resistant material that is well known for use in filaments. For example, tungsten, molybdenum, niobium, tantalum or alloys of these materials can be employed. The thermionic work functions of these materials are fairly high, e.g. W-4.5 ev, Mo-4.2 ev, Nb-4.0 ev and Ta-4.2 ev.

Table I lists a number of relatively low-work-function metals or materials that may be used at the surface 23 of auxiliary electrode 21. Table I also includes the boiling point of the listed metals to indicate their low vapor pressure and nonvolatile character. It will, of course, be clear that other rare earths and transition metals with low work functions and low vapor pressures may also be suitable for use. Alloys of these metals with one another and with other metals in small quantities can also be provided within the scope of the present invention. For example, plutonium as base alloy constituent can beneficially include 1% by weight gallium when employed as auxiliary electrode material.

TABLE I

| Metal | Work function ev | Boiling point K |
|---|---|---|
| Pu | ~3 | 3508 |
| U | 3.27 | 4091 |
| Th | 3.35 | 4123 |
| La | 3.3 | 3743 |
| Ce | 2.6 | 3740 |
| Y | — | 3200 |
| Zr | 4.2 | 3853 |

On combination of the relatively low-work-function materials of Table I with the cathode materials at the cathode surface to form a thin film, an even lower thermionic work function is attained. The film may be merely a partial covering of the cathode surface with a monatomic layer. Table II lists the work functions of various of these thin films. The data in Table II are taken from Kohl, cited above.

TABLE II

| Thin film material | Work function ev |
|---|---|
| W-Th | 2.7 |
| W-Ce | 2.7 |
| W-La | 2.7 |
| W-U | 2.8 |
| W-Y | 2.7 |
| W-Zr | 3.1 |
| Mo-Th | 2.6 |
| Ta-Th | 2.5 |

In order to demonstrate the improvement achieved through use of the present invention, a device similar to that illustrated in FIG. 1 was operated with and without the auxiliary electrode 21. The device used a tungsten filament about 17 cm long, 1.3 mm diameter and was operated at about 2-5 millitorr krypton gas pressure. In separate tests, plutonium with 1 wt % gadolinium and uranium were used as the low-work-function metal within the auxiliary electrode 21. Operation with these materials was very similar in nature and the data obtained on electron emission for a filament temperature of 2200° K was essentially identical. Electron emission data for filament temperatures ranged from 2200°-2900° K with and without the auxiliary, replenishment electrode are given in Table III. Data in columns 1 and 3 are based on actual experiments and the data in columns 2 and 4 computed from data of H. A. Jones and I. Langmuir, General Electric Review, June 1927.

TABLE III

| System Characteristics | With Auxiliary Electrode (1) | Without Auxiliary Electrode | | |
|---|---|---|---|---|
| | | (2) | (3) | (4) |
| Filament T K | 2200 | 2200 | 2500 | 2900 |
| Filament Heater (watts) | 253 (55A, 4.6V) | 253 (55A, 4.6V) | 463 (69.2A, 6.7V) | 898 (88A, 10.2V) |
| Power Required for Replenishment of Atoms (watts) | 63 | — | — | — |
| Thermionic Emission (ma/cm$^2$) | 4685.5 | 13.5 | 302.5 | 4685.5 |
| Thermal Efficiency$^{(A,B)}$ (ma/watt) | 96.8 | .35 | 4.27 | 34.0 |
| Filament Life — Time Required to Evaporate 10% of Weight (hrs) | 1.3 × 10$^{6(C)}$ | 1.3 × 10$^6$ | 8150 | 58 |

$^{(A)}$Remains constant for all values of tungsten filament wire diameters.
$^{(B)}$Ratio of total thermionic emission to sum of power required for filament heating and atom replenishment.
$^{(C)}$This is a minimum value; because of the coating of continuously replenished atoms the life is expected to be much longer, although the amount is unknown.

It can be seen from Table III that the deposition of sputtered electrode atoms onto the surface of the hot-base metal filament causes enhanced electron emissions. Control over the level of enhanced emission is accomplished by adjusting the filament heating voltage, discharge voltage, and the auxiliary electrode voltage. The result of this adjustment is a stabilized, enhanced electron emission with a factor of over 20 higher thermal efficiency compared to that obtained from a filament operated at the usual 2500° K (column 3 of Table III). Comparison with a filament operated at about 2200° K temperature results in an improvement by a factor of over 250 in thermal efficiency. To obtain a thermionic emission of 4685.5 ma/cm$^2$ without atom replenishment from an auxiliary electrode, a filament heating power of 898 watts was required. Only 253 watts were required for the same emission when the auxiliary electrode was used. The use of this higher power level for filament heating is not practical due to the drastically reduced life, calculated to be only 58 hours for the particular filament being considered.

It is important to note that the level of enhanced electron emission was varied through a wide range by compatible adjustment of filament heating voltage, discharge voltage and auxiliary electrode voltage. At each new level the electron emissions remained constant. Physically this indicated a balance between the sputtered atoms deposited from the auxiliary electrode onto the cathode filament and the atoms of U or Pu lost from the filament.

Figure 2:
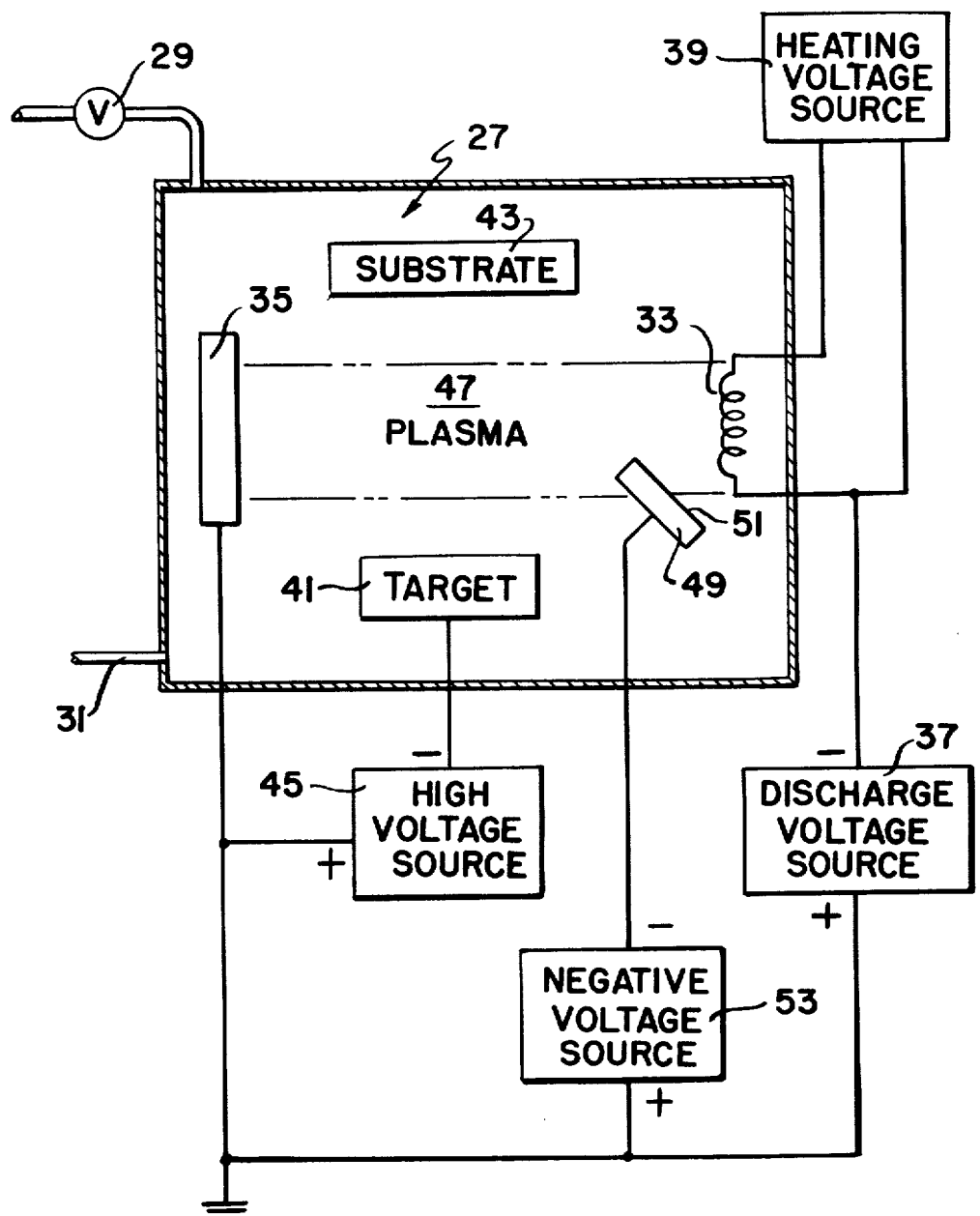
FIG. 2 is a schematic drawing of a supported-gas-discharge sputtering device.

In FIG. 2, the present invention is illustrated within a supported-gas-discharge sputtering device. Such a device is described in BNWL-553, "Application of Sputtering to the Fabrication of Neutron Detector Anodes" by McClanahan et al., Pacific Northwest Laboratory, 1967. The device includes a gas-tight chamber 27 equipped with an inert gas (e.g. Ar, Kr or Xe) supply valve 29 and a connection 31 for providing a vacuum of about 2 to 5 millitorr. The chamber 27 includes a cathode 33 and an anode 35 connected to a discharge voltage source 37 (e.g. up to about 100 volts, 10 amps). The cathode filament is heated by voltage source 39 (e.g. up to about 12 V, 100 amps). Also included within the gas-tight chamber is a target electrode 41 and a substrate 43 for providing and receiving sputter deposited atoms. Target electrode 41 is connected to the negative terminal of a high-voltage source 45 (e.g. up to about 2500 V, 1 amp) for extracting inert gas ions from the plasma illustrated at 47. Plasma gas ions sputter away atoms from the target 41 for deposition on substrate 43.

An an improvement to this prior-art, supported-gas-discharge sputtering device, an auxiliary electrode 49 is disposed adjacent to and with its major surface 51 facing cathode 33. Electrode 49 is positioned nearer to cathode 33 than the anode, target or substrate to permit sputtering of atoms from surface 51 to the cathode without interference with the sputter deposition of substrate 43. The auxiliary electrode is connected to a source of negative voltage 53 (e.g. up to about 200 V, 0.5 amp). Voltage source 53 is sufficient to maintain auxiliary electrode 49 at about 2 to 5 times more negative than the cathode voltage to extract positive ions from the plasma resulting in a sputtering of atoms from surface 51 to the cathode. As an example, the auxiliary electrode can be operated at $-150$ volts with the cathode at $-50$ volts.

It will be understood that each of the voltage sources are preferably variable to effect the operational adjustments suggested in conjunction with the FIG. 1 embodiment. In addition, the voltage sources could be separate as shown or completely or partially combined in suitable circuitry to obtain the desired levels.

The materials employed for electrode 49 can include U or Pu which have proven effective or it would also be reasonable to include any of those listed in Table I to provide a thin film on the cathode of the types listed above in Table II.

Surface 51 of electrode 49 can be part of a layer of different material than the remainder of the electrode. The remainder of electrode 49 can be of a material that would be unlikely to sputter away and contaminate the plasma or it can be of substantially the same materials as that selected for target electrode 41. Such a two-layered auxiliary electrode would provide shielding of the target and substrate from the low-work-function material sputtered onto the cathode. As an example, a target electrode of nickel to be sputter deposited onto a suitable substrate could be combined with an auxiliary electrode having a layer of uranium at surface 51 facing the cathode and a layer of nickel or nickel alloy at the rear surface facing away from the cathode or towards the target electrode 41. Of course, the auxiliary electrode and target electrode are cooled by suitable means where required.

The auxiliary electrode may also be shielded from the discharge by surrounding it on all sides except the surface facing the cathode with a closely spaced (few millimeters) electrically isolated shield.

Although the present invention has been described in detail with specific embodiments, variations in arrangements and shapes of electrodes may be desirable. For example, the auxiliary electrode may be shaped and sized to optimize sputter deposition onto the cathode and to extend the electrode life as required by a particular application. The optimization of the geometrical relationship between the auxiliary electrode and the cathode may also be possible to produce a further increase in thermal efficiency.

It will be seen from the foregoing that the present invention provides an improved gas discharge device that replenishes low-work-function, easily polarized atoms on the cathode surface. The improvement permits increased electron emission from a hot cathode at a somewhat reduced temperature and at the same time increases the cathode filament life. It is shown in a particular application within a supported-gas-discharge sputtering device but can also be incorporated into other devices for providing high-intensity electrons or ion beams.

The embodiments of the invention in which an exclusive property or privilege is claimed are defined as follows:

1. In a device for producing an ion beam including a gas-tight chamber with means for providing ionizable, inert gas at near vacuum pressures within said chamber, said chamber containing a cathode comprising a heat-resistant material and having an outer electron emissive surface adapted for thermionic emission; an anode spaced apart from said cathode; said anode and cathode interconnected with a source of sufficient voltage to establish an ionized gas plasma between said electron emissive surface of said cathode and said anode; the improvement wherein an auxiliary electrode is disposed with at least one surface exposed to and facing electron emissive surface of said cathode and positioned so as to be exposed to said ionized gas plasma, said at least one surface of the auxiliary electrode containing a low-work-function material which when dispersed within the electron emissive surface of said cathode material provides a thermionic work function lower than the work function of said cathode material, said cathode and auxiliary electrode being more closely positioned than the positioning of said cathode to said anode and wherein there are provided electrical means for maintaining said auxiliary electrode at a more negative potential that that of said cathode such that ionized gas from said plasma impinges on said one surface of said auxiliary electrode to sputter-deposit said low-work-function material onto said electron emissive surface of said cathode.

2. The improved device of claim 1 wherein said electrical means is adapted to maintain said auxiliary electrode at about 2-5 times more negative potential than that of said cathode.

3. The improved device of claim 1 wherein said material at said one surface of said auxiliary electrode is selected from the group of low-vapor-pressure, low-work-function materials consisting of Pu, U, Th, La, Ce, Y, Zr.

4. The improved device of claim 1 wherein said material contained within said one surface of said auxiliary electrode is Pu or U.

5. The improved device of claim 1 wherein said cathode is provided with heating means for producing a thermionic emission and said cathode includes a thin film at its surface of said cathode material and a sputter deposited material from said auxiliary electrode.

6. The improved device of claim 5 wherein said thin film at said cathode surface comprises W, Mo, Nb, or Ta and a sputter deposited, low-work-function material selected from the group consisting of Pu, U, Th, La, Ce, Y and Zr.

7. The improved device of claim 5 wherein said thin film at said cathode surface includes sputter deposited U or Pu ont a surface of W, Mo, Nb, or Ta.

8. The improved device of claim 1 wherein said vacuum chamber also contains a target electrode connected to a second voltage source at a more negative potential than that of said cathode or said auxiliary electrode to extract gas ions from said plasma and thereby sputter portions of target material, said vacuum chamber further containing a substrate disposed to receive said sputtered target material.

9. The improved device of claim 8 wherein said auxiliary electrode is disposed closer to said cathode than said target, substrate or anode within said vacuum chamber.

10. The improved device of claim 8 wherein said auxiliary electrode surface facing away from said cathode is of the same material as that of said target material.

* * * * *